(12) United States Patent
Ramsay

(10) Patent No.: US 6,609,877 B1
(45) Date of Patent: Aug. 26, 2003

(54) VACUUM CHAMBER LOAD LOCK STRUCTURE AND ARTICLE TRANSPORT MECHANISM

(75) Inventor: Bruce Gordon Ramsay, Novato, CA (US)

(73) Assignee: The BOC Group, Inc., Murray Hill, NJ (US)

(*) Notice: Subject to any disclaimer, the term of this patent is extended or adjusted under 35 U.S.C. 154(b) by 404 days.

(21) Appl. No.: 09/679,498

(22) Filed: Oct. 4, 2000

(51) Int. Cl.[7] ............................................. B65G 49/07
(52) U.S. Cl. ...................... 414/939; 414/940; 414/941; 118/719; 118/733
(58) Field of Search ................................ 414/939, 940, 414/941; 118/719, 733

(56) References Cited

U.S. PATENT DOCUMENTS

| 4,341,582 | A |   | 7/1982  | Kohman et al. |
| 4,584,045 | A |   | 4/1986  | Richards |
| 4,632,624 | A |   | 12/1986 | Mirkovich et al. |
| 4,676,884 | A |   | 6/1987  | Dimock et al. |
| 4,861,563 | A |   | 8/1989  | Shekerjian et al. |
| 4,915,564 | A |   | 4/1990  | Eror et al. |
| 5,674,368 | A | * | 10/1997 | Hashimoto et al. .... 204/298.25 |
| 6,042,623 | A | * | 3/2000  | Edwards .................. 29/25.01 |
| 6,190,103 | B1 | * | 2/2001 | Erez et al. ............... 414/217 |
| 6,382,895 | B1 | * | 5/2002 | Konishi et al. ........... 414/217 |
| 2002/0031420 | A1 | * | 3/2002 | Kroeker ................... 414/217 |

FOREIGN PATENT DOCUMENTS

JP 10303276 11/1998
WO WO 00/18980 4/2000

OTHER PUBLICATIONS

Pulker, H.K., "Coatings on Glass," *Thin Films Science and Technology*, 6, Elsevier Science B.V. (1984) pps. 207–213, no month.

* cited by examiner

*Primary Examiner*—Alexander G. Ghyka
(74) *Attorney, Agent, or Firm*—Philip H. Von Neida; Salvatore P. Pace

(57) ABSTRACT

A vacuum chamber used for processing articles, such as integrated circuit wafers, display panels, and the like, has a small load lock chamber formed at an opening in a wall of the chamber by a moveable article supporting surface within the chamber and a cover outside of the chamber. The supporting surface and cover are sealed to the chamber wall when urged against it. Articles placed into the load lock chamber, when the cover is opened, are moved into the vacuum chamber for processing by moving the supporting surface away from the wall after the cover has been closed and a vacuum established in the load lock chamber. Articles are removed from the vacuum chamber in a reverse manner. Various mechanisms are describe for moving the articles, including a particular robotic device that simultaneously swaps the positions of two articles between the supporting surface and a processing location within the vacuum chamber by first pulling the articles together and then rotating them in a half-circle. Integrated circuit wafers are preferably carried on a domed surface formed of wedge shaped pieces fit together on a frame, where the wedge shaped pieces and their wafers are individually removable from the frame for transfer to another frame at a different location.

18 Claims, 9 Drawing Sheets

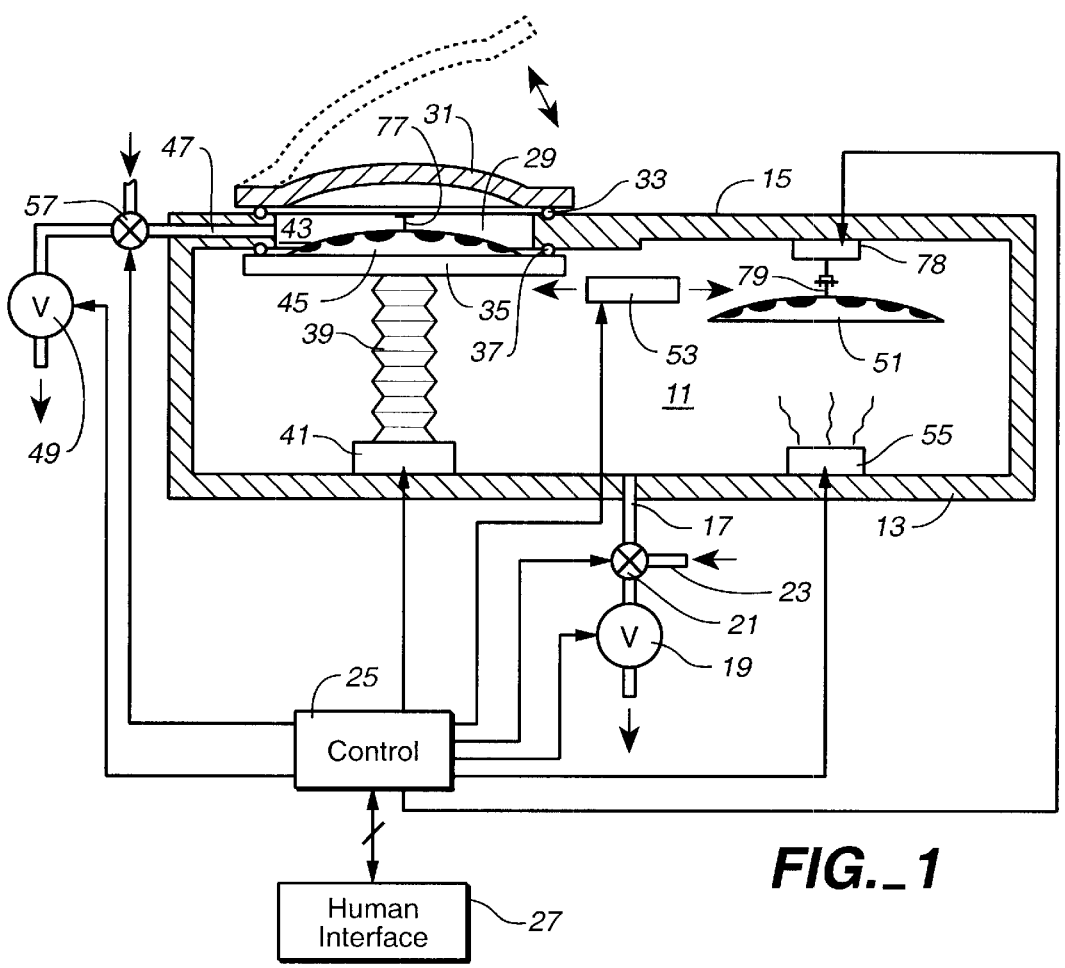
FIG._1
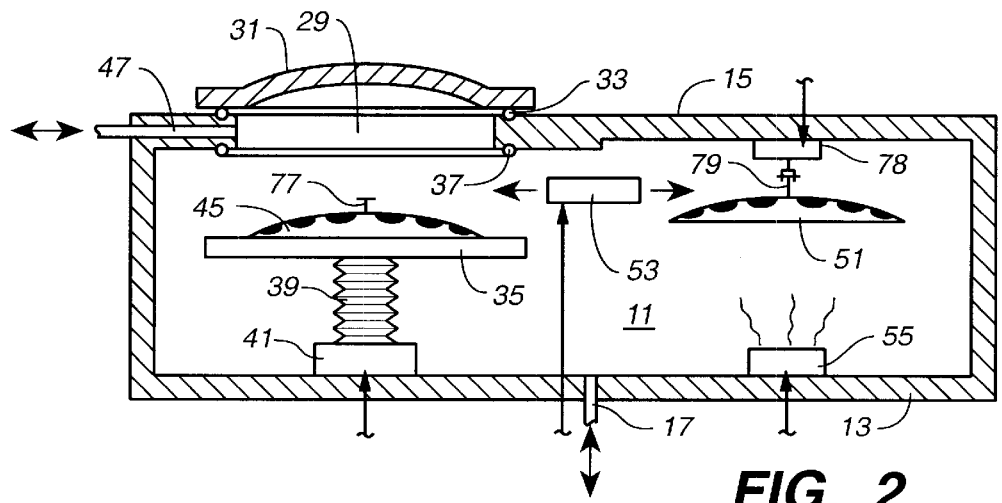
FIG._2

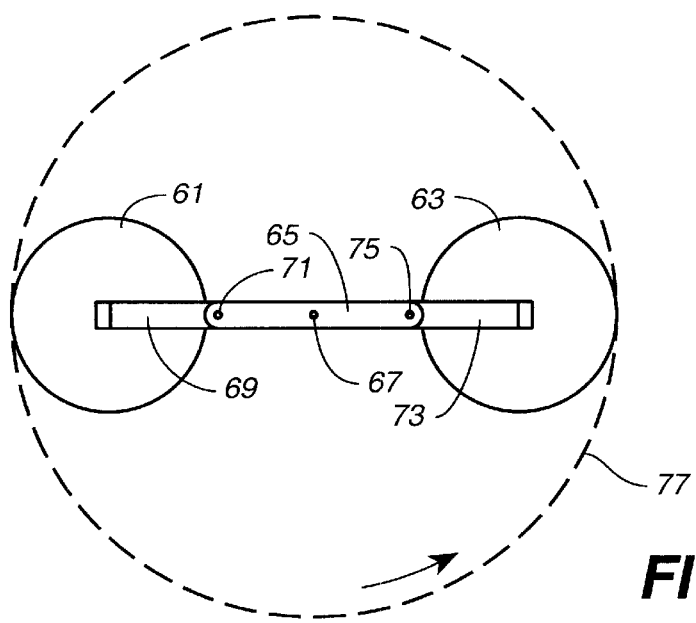
FIG._3A
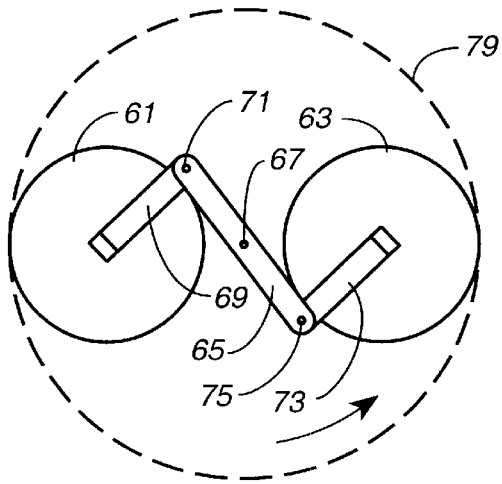
FIG._3B
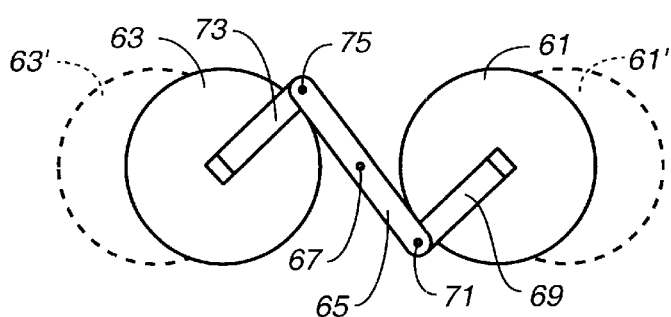
FIG._3C
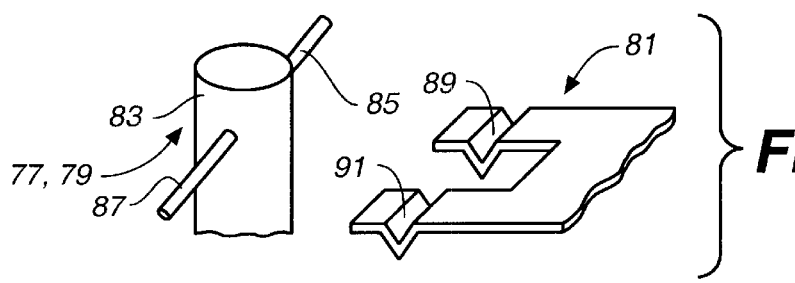
FIG._4

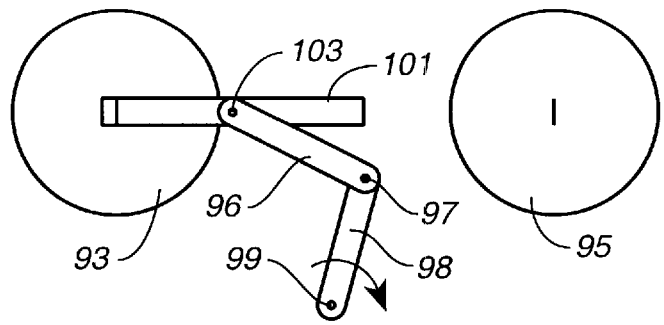
FIG._5A
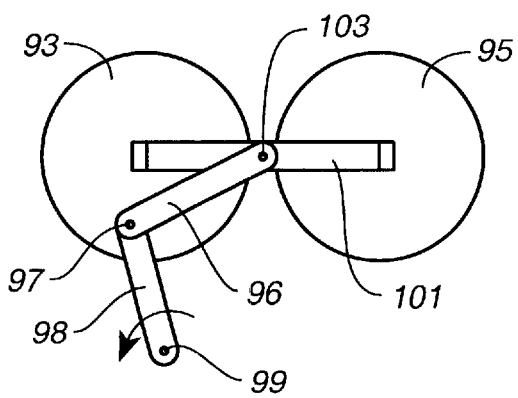
FIG._5B
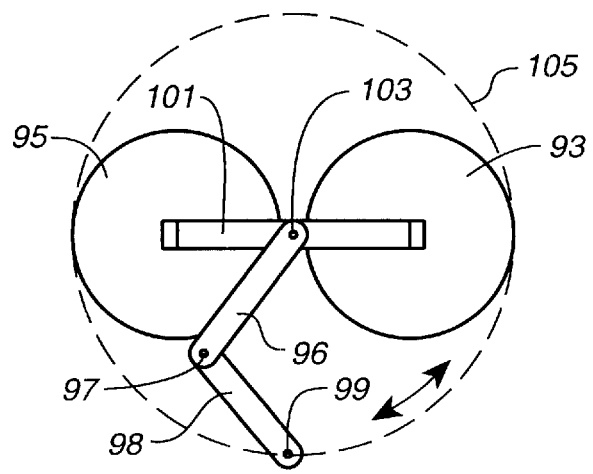
FIG._5C

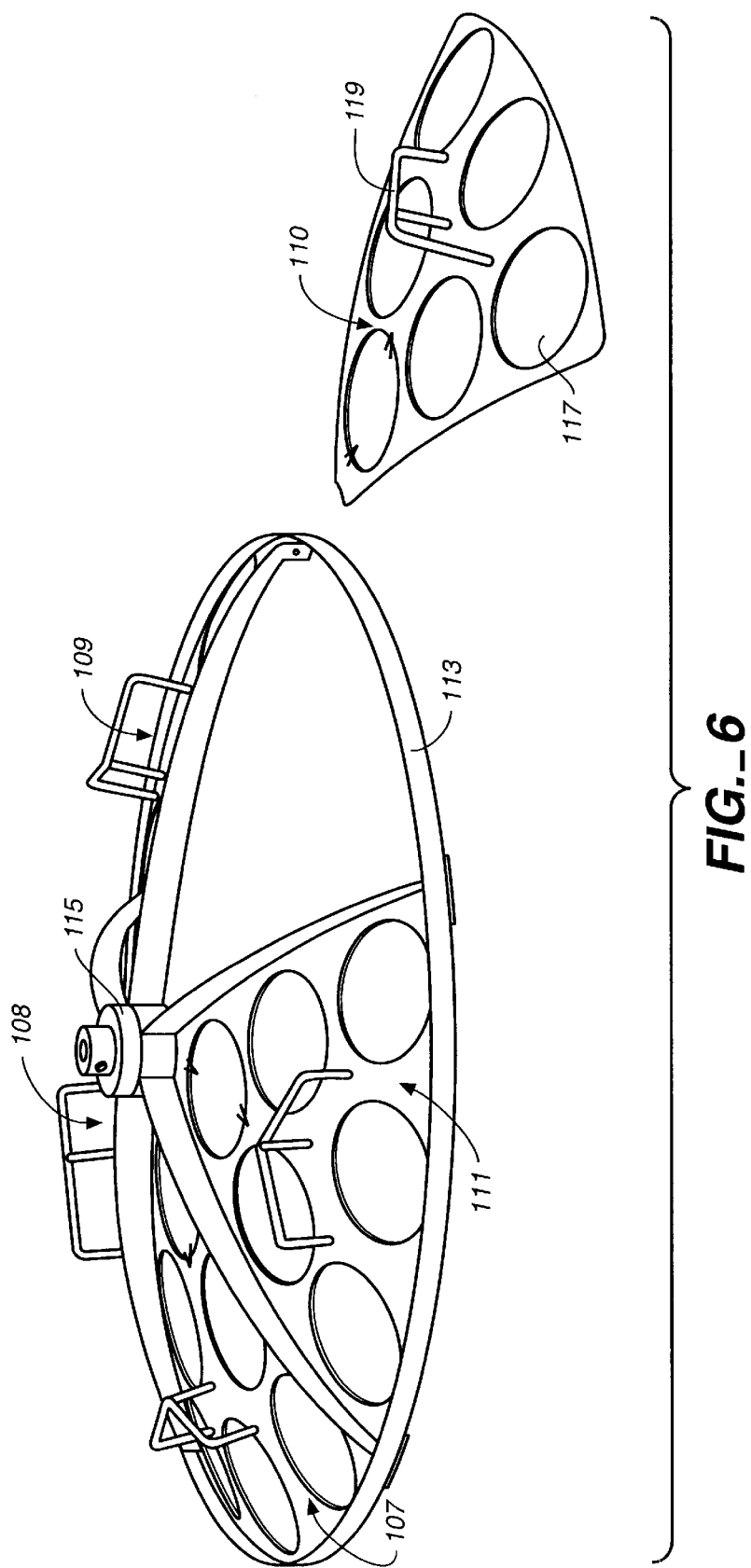
FIG._6

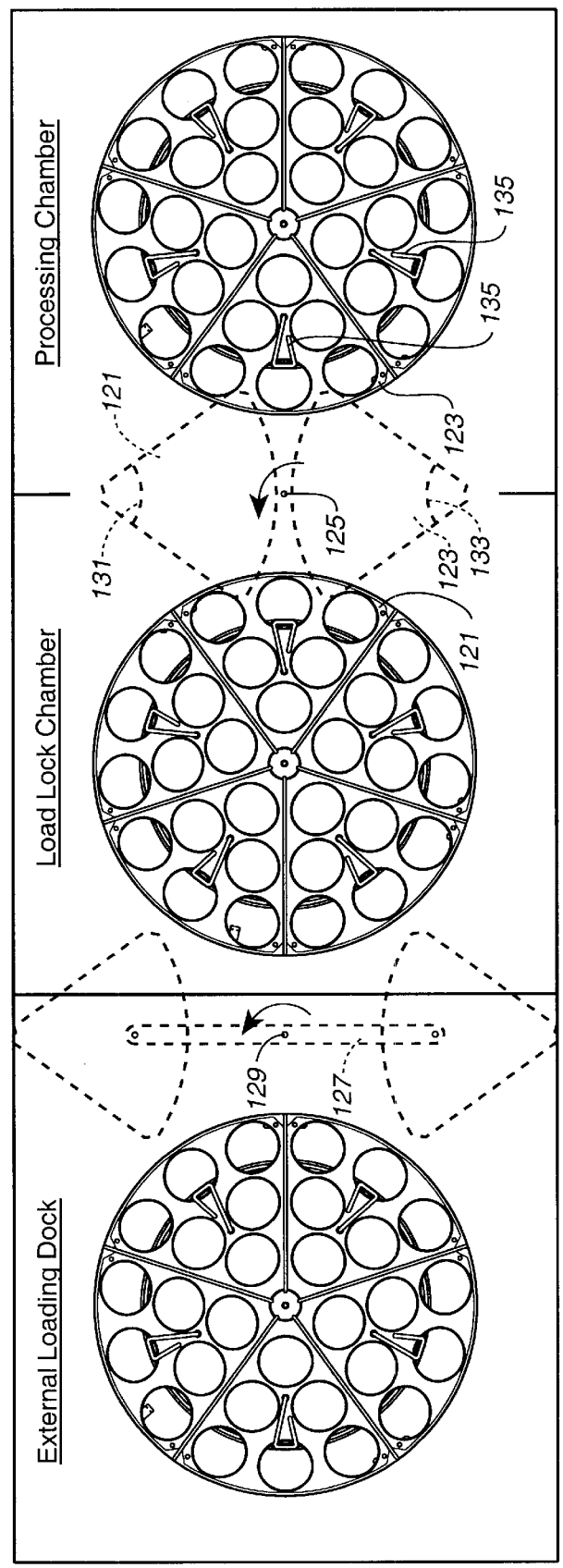
FIG._7

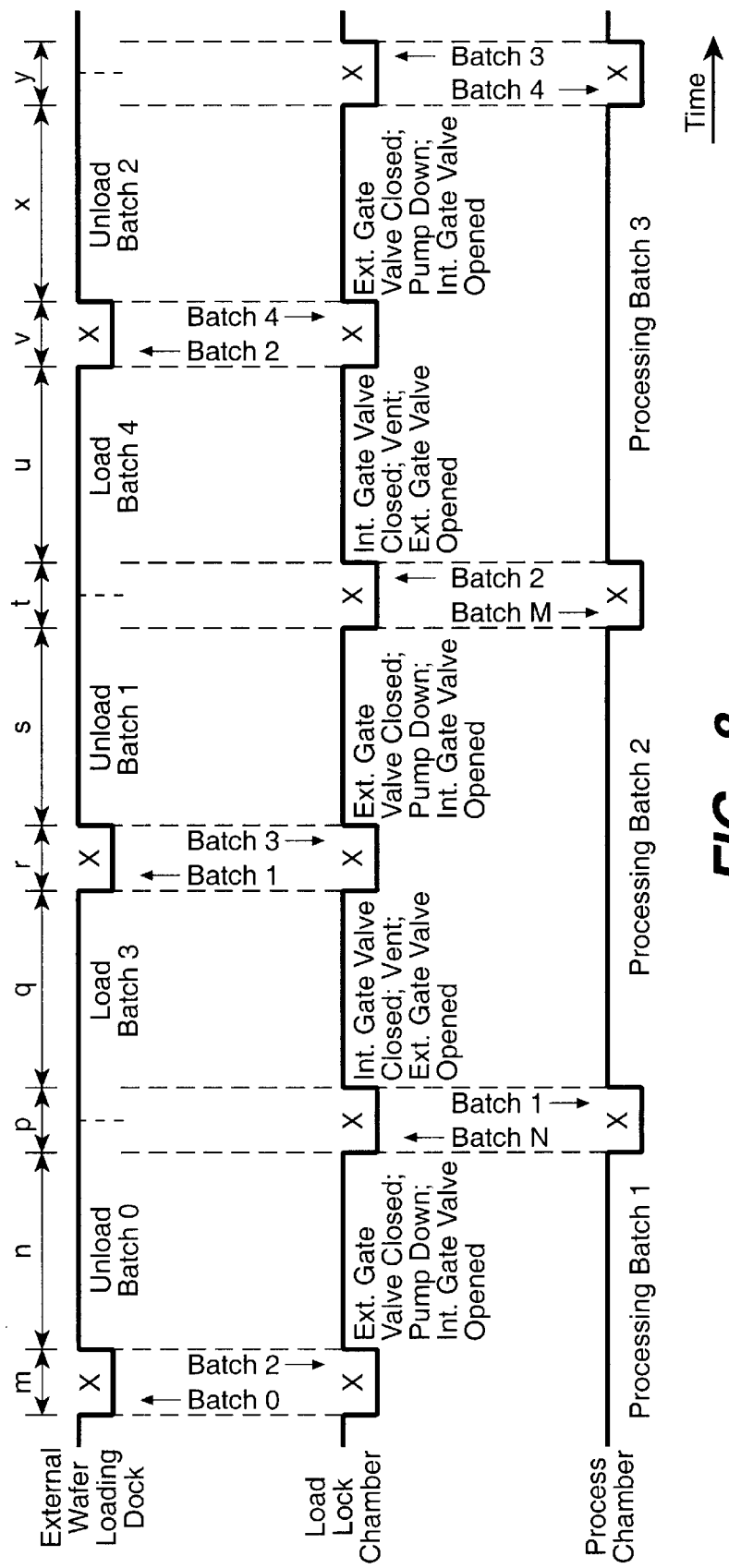
FIG._8

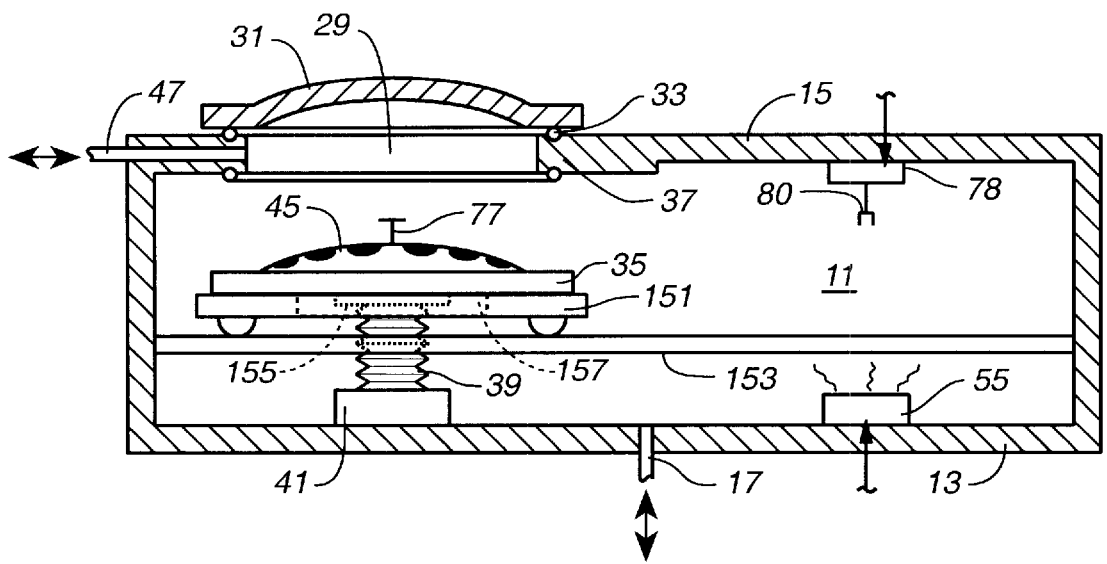
FIG._9
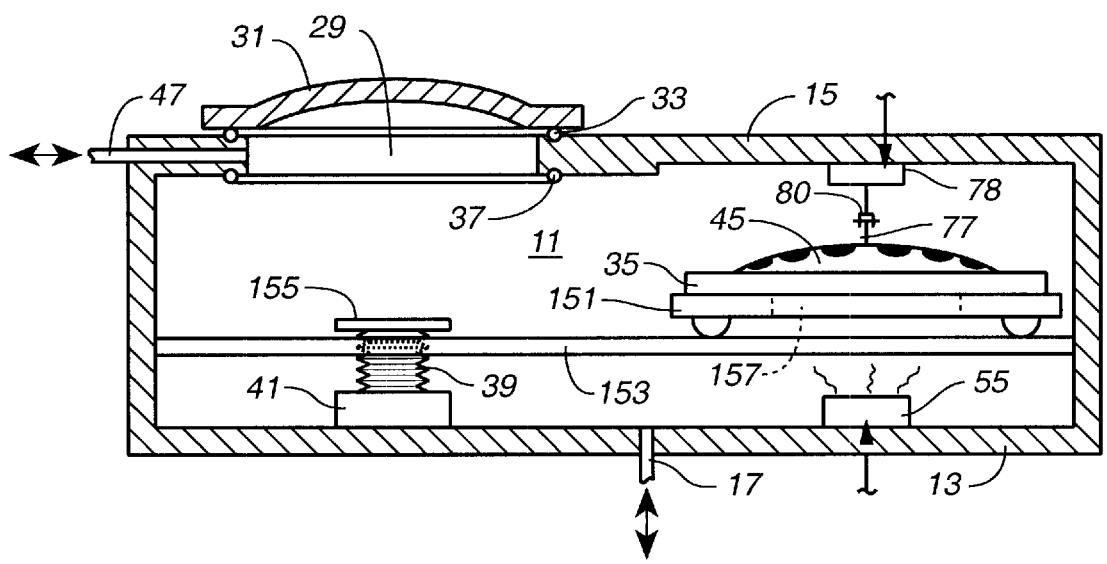
FIG._10

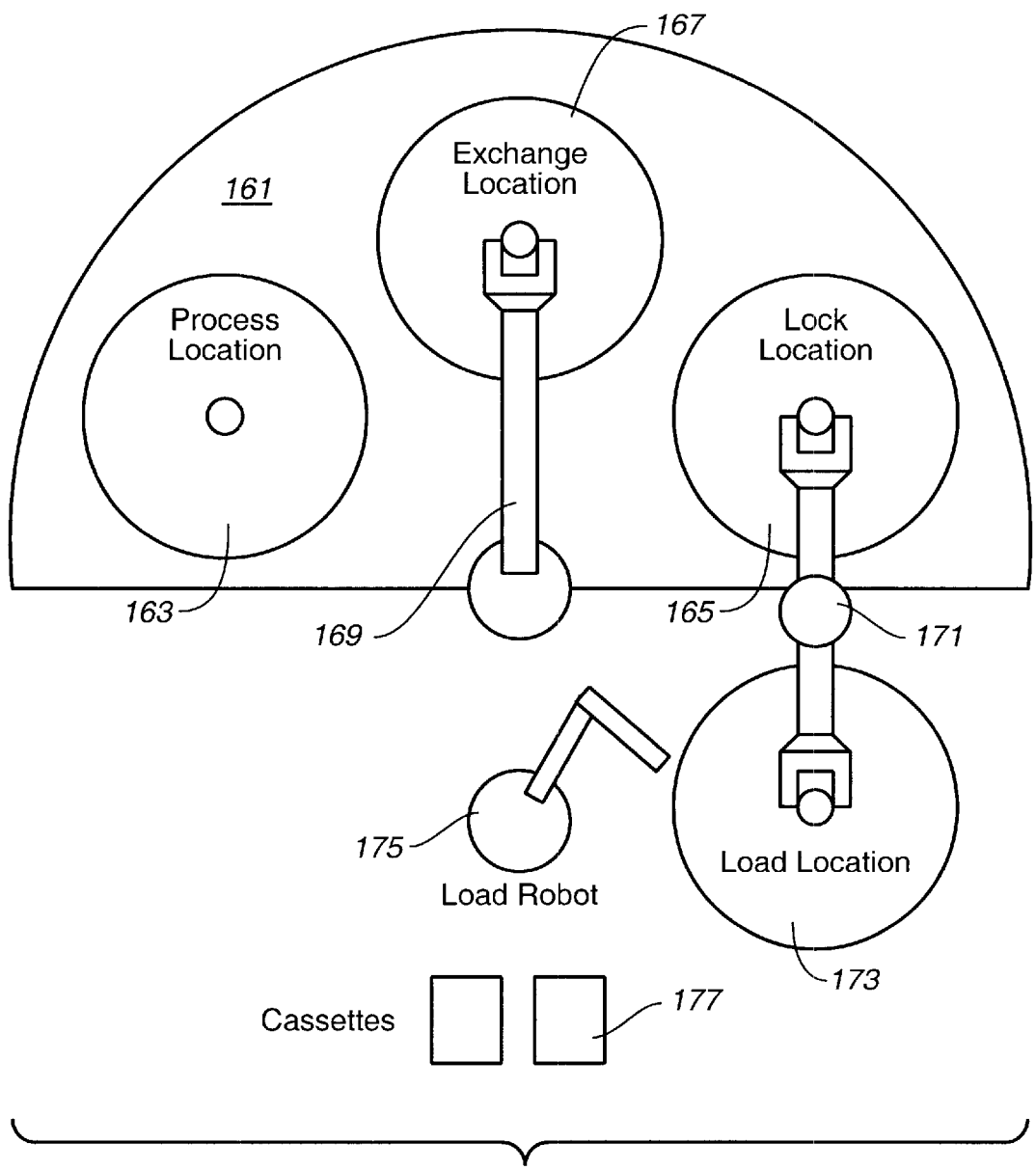
FIG._11

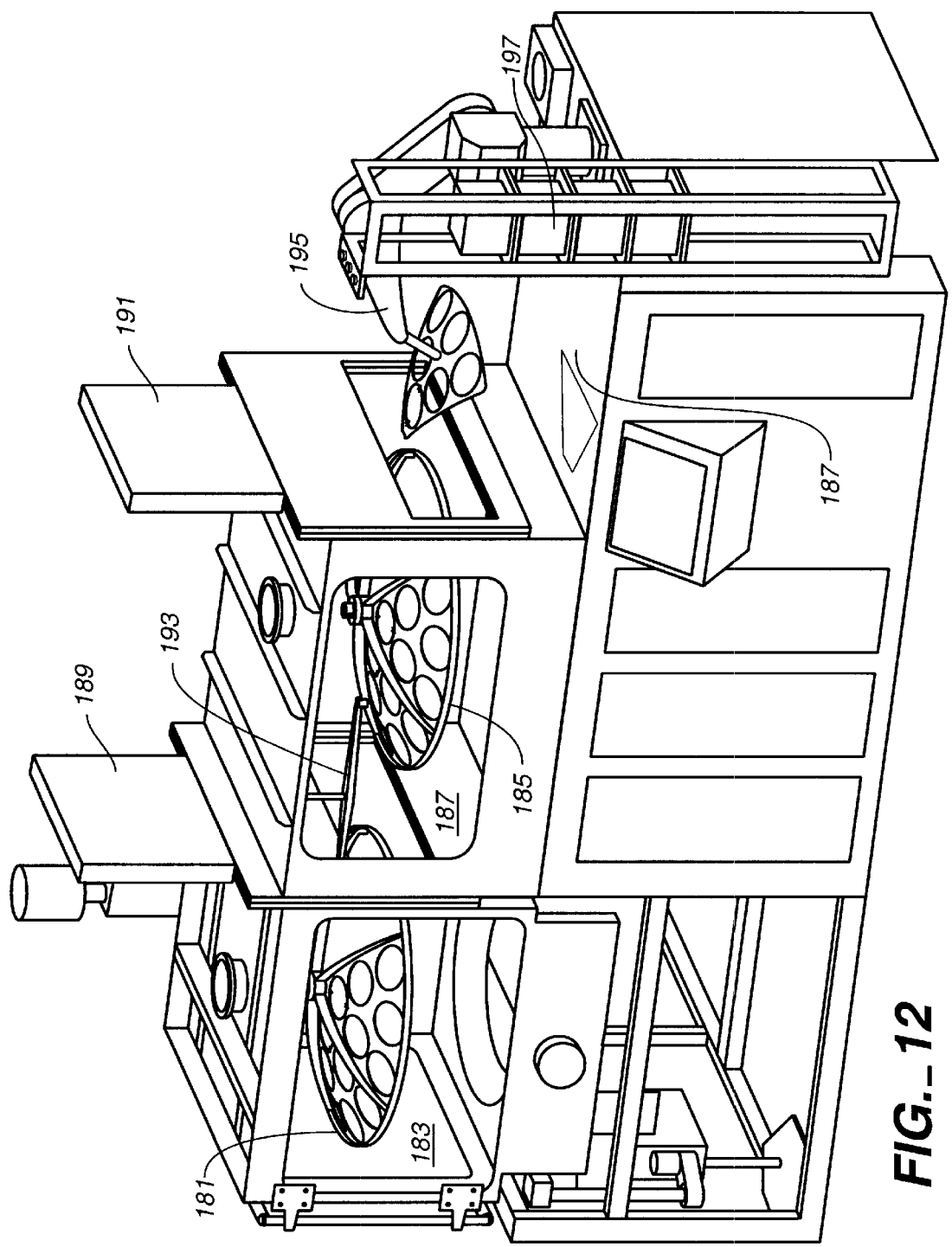
FIG._12

VACUUM CHAMBER LOAD LOCK STRUCTURE AND ARTICLE TRANSPORT MECHANISM

BACKGROUND OF THE INVENTION

The present invention relates generally to the transport and handling of articles being subjected to vacuum processes, and, more specifically, to the transport and handling of integrated circuit wafers being processed in vacuum chambers, such as by evaporation, vapor deposition, sputtering, plasma etching and the like.

Integrated circuits, most commonly formed on either silicon (Si) semiconductor or gallium arsenide (GaAs) wafer substrates, are commonly subjected to one or more process steps within a vacuum chamber in the course of forming a large number of replicas of an integrated circuit on each wafer. In order to avoid having to vent the vacuum processing chamber each time one or more wafers is loaded into or removed from the processing chamber, and then re-establish a vacuum before processing can begin, the wafers are moved through an intermediate load lock chamber. The load lock chamber is connected to the vacuum chamber through a gate valve, and has another gate valve opening to the outside. The pressure within the load lock chamber is controllable independently of that in the processing chamber.

Wafers or other articles to be processed are loaded into the processing chamber by first moving them into the load lock chamber through its outside gate valve while the gate valve connecting the two chambers remains closed. The processing chamber is maintained at or very near its processing pressure during loading and unloading. The outside gate valve is then closed with the articles in the load lock chamber, and the pressure within the load lock chamber is reduced to a level about equal to that of the vacuum chamber. The gate valve between the chambers is then opened and the articles moved into the processing chamber through that gate valve. This gate valve is then closed and the articles in the processing chamber are processed. These steps are performed in a reverse order when removing articles from the processing chamber to the outside through the load lock chamber. The load lock chamber is vented after the articles are moved into it from the processing chamber when the load lock chamber is at the reduced pressure of the processing chamber. Some vacuum processing machines have two load lock chambers connected by separate gate valves to the processing chamber in order to increase the throughput of wafers processed, one load lock chamber being used for loading and the other for unloading.

SUMMARY OF THE INVENTION

According to one aspect of the present invention, briefly and generally, a load lock chamber having a very small volume is formed within the processing chamber by a wall that is moveable into the processing chamber to unseal the load lock chamber for allowing articles to be moved between it and the processing chamber. In a preferred form, the wall is oriented horizontally and also serves as a carrier for the wafers or other articles being processed. In this arrangement, the wall moves up and down within the processing chamber to both close and open the load lock chamber to the processing chamber. In an upward position, the wall forms a seal that isolates the load lock chamber from the processing chamber. In a lowered position, the wall unseals the load lock chamber from the processing chamber and positions the articles carried by it for easy transfer to the processing chamber.

According to another aspect of the present invention, briefly and generally, a technique and mechanism are provided for moving articles between two positions, such as between one position in the load lock chamber (either that described above or a conventional load lock chamber) and another position in the processing chamber. Rather than moving each article one at a time, articles at the two positions are swapped by a common rotary motion of the mechanism. In order to minimize the area required for the rotary motion, the articles to be exchanged are preferably first moved close together with an axis of rotation positioned between them. The small amount of area taken by the rotation is a particular advantage for transferring articles between the load lock chamber and the processing chamber, since this allows the chamber to be made smaller.

An advantage of the mechanism that simultaneously swaps the positions of two articles is that the throughput of the vacuum processing is increased. When used to transfer articles between the load lock chamber and the processing chamber, a processed article is moved out of the processing chamber into the load lock chamber and a fresh article is moved at the same time from the load lock chamber into the processing chamber. The same technique can be used with another transfer mechanism to simultaneously remove a processed article from the load lock chamber to the outside and load a fresh unprocessed article from the outside into the load lock chamber. According to a further aspect of the present invention, these simultaneous transfers increase the amount of parallelism in the processing of the wafers or articles.

In one specific application of the load lock chamber and article moving mechanism, they are included in machines that evaporate material onto wafers within the vacuum processing chamber. The wafers are held on a domed shape wafer carrier during the evaporation. Since the wafers can be very fragile, it is preferred to move the wafer carrier, with wafers attached, into and out of the processing chamber, rather than moving the individual wafers. Since such domed carriers can be quite large and awkward to move, according to a further aspect of the present invention, briefly and generally, the domed surface may be divided into wedge shaped segments that are removably held on a circular frame. These segments are moved one at a time between a frame maintained in the processing chamber and one in the load lock chamber. This keeps low the weight and size of the items being transferred. Another feature, in order to further minimize the area necessary to swap locations of two such dome pieces, their pointed ends may be truncated without significant loss of wafer carrying capacity.

For situations where a high throughput of the systems described above is unnecessary, a simpler and lower cost article transfer mechanism may be used within the vacuum processing chamber of the type described above in the first paragraph of this Summary. According to yet another aspect of the present invention, therefore, a carriage is moved back and forth between positions under the load lock chamber and the processing area within the vacuum chamber, in order to transfer articles between these two positions. The carrier for the wafers or other articles being processed, which also serves as a removable load lock chamber wall, is lowered onto and raised from the carriage from below by an elevator structure that passes through an opening in the carriage. This elevator structure retracts below the carriage when the carriage is being moved.

Additional features, advantages and details of the present invention are included in the following description of exemplary embodiments of it, which description must be taken in conjunction with the accompanying drawings.

BRIEF DESCRIPTION OF THE DRAWINGS

FIG. 1 is a schematic diagram of a vacuum processing apparatus that includes certain aspects of the present invention;

FIG. 2 shows the apparatus of FIG. 1 with one of its elements moved to a different-position;

FIGS. 3A, 3B and 3C illustrate one embodiment of an article transfer mechanism that can be used in the apparatus of FIGS. 1 and 2, as well as elsewhere;

FIG. 4 shows a structure for lifting articles that may be used in the article transfer mechanism of FIGS. 3A and 3B;

FIGS. 5A, 5B and 5C illustrate a second embodiment of an article transfer mechanism that can be used in the apparatus of FIGS. 1 and 2, as well as elsewhere;

FIG. 6 shows a segmented domed wafer carrier for use in the apparatus of FIGS. 1 and 2, as well as elsewhere;

FIG. 7 illustrates in plan view the operation of the apparatus of FIGS. 1 and 2, or more conventional vacuum processing apparatus, with the segmented domed wafer carrier of FIG. 6;

FIG. 8 is a timing diagram that illustrates the operation of vacuum processing apparatus such as that shown in FIG. 7;

FIG. 9 is a schematic diagram of a vacuum processing apparatus similar to that illustrated in FIGS. 1 and 2 but with a different type of article transfer mechanism within the vacuum chamber;

FIG. 10 shows the apparatus of FIG. 9 with its article transfer mechanism in a different position;

FIG. 11 schematically illustrates yet different article transfer devices within and outside of the vacuum chamber; and FIG. 12 is a partially cut-away view of a complete machine for processing wafers that includes devices for transporting wafers therethrough.

DETAILED DESCRIPTION OF EXLEMPARY EMBODIMENTS

Referring initially to FIGS. 1 and 2, the structure of a vacuum chamber 11 is schematically illustrated. The chamber 11 is surrounded by walls included a bottom wall 13 and a top wall 15. The pressure within the chamber 11 is reduced by removing air and other gasses through a passage 17 by a vacuum pump 19. The chamber 11 is vented by operation of a valve 21 to allow a gas, usually an inert gas such as nitrogen, to enter the chamber 11 through a passage 23 and the 25 passage 17. A computer based control system 25 controls operation of the vacuum pump 19, the venting valve 21 and other elements of the apparatus of FIG. 1 described below, as shown in the drawing. Human interface devices 27, which may include a monitor and a keyboard, allow the operator of the apparatus to set operating parameters and otherwise control its operation.

Articles to be processed in the vacuum chamber 11, the articles in this specific example being integrated circuit wafers, are transferred into and out of the chamber 11 through an opening 29 in the top chamber wall 15. Two elements operate in cooperation with each other to maintain the opening 29 sealed against air or other gasses entering the vacuum chamber 11 through the opening 29. One of them is a cover 31 that provides this seal when positioned against a sealing element 33 carried on an outside of the wall 15 around the opening 29. As shown in dashed outline, however, the cover 31 is removable from the wall 15 to allow wafers to be passed through the opening 29. The second sealing element is a wafer support 35 which closes off the opening 29 when urged upward against a sealing element 37 carried by an underside of the top chamber wall 15. The support 35 is so urged by an appropriate mechanism 39 and motive source 41 which are also operable to lower the surface to a position shown in FIG. 2 away from the top wall 15. The motive source 41 may be an electric stepper motor, an electric servo motor, a pneumatic device or any other conventional device that, when cooperating with the mechanism 39, provides linear vertical motion to the support 35. An example of the mechanism 39 is a lead screw that is rotated by the motive source 41. During normal operation of the apparatus of FIGS. 1 and 2, one of the cover 31 or support 35 seals the opening 29 at all times.

The cover 31 and wafer support 35 together form a load lock chamber 43 (FIG. 1) between them. The cover 31 operates as a gate valve of the load lock chamber 43 to the outside. The wafer support 35 operates as a gate valve of the load lock chamber 43 to the vacuum chamber 11. Multiple wafers are conveniently moved through the load lock chamber 43 at one time on a carrier 45. To load the vacuum chamber 11 with a fresh batch of wafers to be processed, such a carrier 45 is placed into the load lock chamber 43 from the outside when the cover 31 is opened and the wafer support 35 is sealed against the top wall 15. Wafers are preferably pre-loaded onto the carrier prior to the carrier being positioned on the support 35 for increased throughput of wafers through the processing machine but, alternatively, can be loaded onto a carrier while positioned on the support 35 in the load lock chamber 43. The cover is then closed to seal the load lock chamber from the outside and the pressure is reduced in the load locked chamber 43 to a level approximating that within the vacuum chamber 11. This is done through a passage 47 by a vacuum pump 49. Once the pressure has been reduced, the wafer support 35 is unsealed from the top wall 15 and lowered to the position shown in FIG. 2, while the cover 31 remains sealed to the outside of the top wall 15. The wafer carrier is then removed from the support 35 and moved into the position shown to be occupied by another carrier 51 for processing the wafers on the carrier. A movement mechanism 53 is generally illustrated in FIGS. 1 and 2 for accomplishing this.

As a specific example, the wafer processing that is illustrated is the evaporation of a metal or other material onto the wafers when on a carrier 51 that is held suspended from the top wall 15 of the vacuum chamber 11. A source 55 of material being evaporated onto the wafers within the vacuum processing chamber 11 is illustrated. A carrier of wafers being processed in this manner is typically a domed shape, such as that shown for the carriers 45 and 51. If a process other than evaporation is being performed within the vacuum chamber 11, a different type and shape of wafer carrier may be used. A flat plate, where the wafers are carried on a planar surface, or a boat, where the wafers are held upright, are other possibilities. Further, each wafer can alternatively be transferred and processed individually but this is usually quite inefficient and not suitable for the most fragile gallium arsenide wafers.

A wafer carrier is removed from the vacuum chamber 11, after its wafers have been subjected to the processing therein, by a series of steps that are the reverse of those described above for loading the wafer carrier. A carrier, such as the carrier 45 illustrated in FIGS. 1 and 2, is placed onto the support 35 by the transfer mechanism 53, in a manner such as that described below, when the support 35 in is its lower position shown in FIG. 2. The support 35 is then raised by the mechanism 39 and 41 to a position where it seals with the underside of the top wall, as illustrated in FIG.

1. The cover 31 remains sealed over the opening 29 during these steps. The load locked chamber 43, now a separate compartment sealed from the outside and the vacuum chamber 11, is then vented through a valve 57 and the passage 47 by the introduction, preferably, of an inert gas. When the load lock chamber 43 has a pressure that is at or near that outside of the apparatus, the cover 31 is opened and the wafer carrier removed from the support 35 through the wall opening 29. The vacuum chamber 11 remains sealed from the outside during the carrier's removal by the support 35 being sealed to the top wall 15.

The load lock chamber 43 of FIGS. 1 and 2 may be viewed in a more traditional sense by noting that the passage 29 through the wall 15 has an outer opening, which is selectively closed and sealed by the element 31, and an inner opening, which is selectively closed and sealed by the element 35. Rather than using a traditional sliding gate valve to open and close the opening of the passage into the vacuum chamber 11, the element 35 is moved back and forth in a direction that is substantially perpendicular to a plane of that inner opening. Further, this valve element 35 also serves to move the articles part of the way between the load lock chamber 43 and the processing chamber 11, which is quite different from the function performed by the usual gate valve. Although this structure is formed in a top wall of the housing, a somewhat modified structure could be formed about a passage through a vertically oriented side housing wall where the valve element sealing the opening of the passage into the processing chamber also carries articles with it as it moves into the processing chamber away from the opening and back again to seal the inner opening of the passage.

The wafer carrier transfer mechanism 53 of FIGS. 1 and 2 exchanges the positions of the carriers 45 and 51, in order to place fresh wafers within the vacuum chamber 11 for processing and position wafers already processed on the support 35 for removal from the vacuum chamber 11. The mechanism 53 can be of a type that first moves one of the carriers 45 and 51 temporarily to a third position, followed by the transfer of the other carrier, and then followed by the further movement of the carrier from the temporary third position. A disadvantage of this type of moving mechanism is that it takes some time to carry out all of several individual steps, and requires the vacuum chamber to have enough space for the temporary third position of the wafer carrier.

Therefore, the transfer mechanism 53 is preferably of a type that simultaneously swaps the positions of the wafer carrier located on the support 35 and the wafer carrier hanging in the processing vacuum chamber. One embodiment of the transfer mechanism 53 to do so is illustrated in FIGS. 3A, 3B and 3C. The swapping of the positions of two wafer carriers 61 and 63 is illustrated. The transfer mechanism includes a main arm 65 that pivots around a fixed point 67. Two shorter arms 69 and 73 are attached to opposite ends of the arm 65 in a manner to be rotatable with respect to the arm 65 about respective connection points 71 and 75. A single arm having a length equal to the combined length of the arms 65, 69 and 73 (as best illustrated in FIG. 3A) could be used with advantage to swap positions of the carriers 61 and 63 by simply rotating that arm one-hundred eighty degrees about the point 67. But this requires that a large area within the dashed circle 77 be made available for this purpose. When being accomplished within the vacuum chamber 11 (FIGS. 1 and 2), this large swing requires the width of the chamber 11 to be much greater than otherwise necessary to fit one of the carriers 61 or 63 at a time.

Therefore, the carriers 61 and 63 are first moved laterally together before the arm 65 is rotated about the point 67, as shown in FIG. 3B. The carriers are moved together by simultaneously rotating each of the arms 69 and 73 about their respective pivot points 71 and 75 on the main arm 65, while the main arm 65 is being rotated clockwise about the pivot point 67 through an acute angle that depends upon the size of the carriers and other geometry of the mechanism. The carriers are thus moved linearly toward each other.

Now, when the arms and carriers in the positions of FIG. 3B are rotated substantially one-hundred eighty degrees about the pivot point 67, a much smaller area within a dashed circle 79 is required for the rotation. FIG. 3C shows the carriers and the elements of the transfer mechanism after that rotation, in solid lines. A next step is to linearly move the carriers 61 and 63 away from each other by a simultaneous rotation of the arms 65, 69 and 73 about their respective pivot points until the arms are in a straight line. The main arm 65 is rotated in a counter-clockwise direction about its pivot point 67. This results in the carriers 61 and 63 being moved to the positions 61' and 63' shown in dotted outline in FIG. 3C. The carrier 61 is in then in the location formerly (FIG. 3A) occupied by the carrier 63, and the carrier 63 is in the location formerly occupied by the carrier 61.

With reference to FIG. 4, an example structure 81 is illustrated for the free ends of the arms 69 and 73 of FIGS. 3A–C to easily lift and move a wafer carrier. A hook like device is attached to the middle of each wafer carrier so that the carrier is balanced when lifted by the structure 81. Such a hook 77 is attached to the wafer carrier 45, and another hook 79 to the carrier 51 (FIGS. 1 and 2). An example of this hook is shown in FIG. 4. A post 83 is attached to the center of the carrier to extend upward of the carrier. Pins 85 and 87 extend outward of opposite sides of the post 83 near its end. The lifting structure 81 includes two arms that are spaced apart to straddle the post 83 as they are moved under respective pins 85 and 87 to engage the pins within respective recesses 89 and 91 of the arms.

The motor sources that move the arms described with respect to FIGS. 3A–C and 4 are not shown in those drawings but will be understood to be included as part of the transfer mechanism 53 of FIGS. 1 and 2, and controlled by the control system 25. A simple electrical motor attached to an underside of the top wall 15 of the vacuum chamber 11 can rotate the main arm 65. Small motors attached to the ends of the arm 65 can rotate the arms 69 and 73 with respect to the arm 65, and provide the small amount of vertical motion used by the carrier lifting system of FIG. 4, if that is used. Of course, there are many other devices and techniques available that can be used instead to move the elements of the mechanisms of FIGS. 3A–C and 4 in the manner described.

An alternative to the carrier position swapping mechanism of FIGS. 3A–C is shown in FIGS. 5A–C. The positions of two carriers 93 and 95 are being swapped, such as is done within the vacuum chamber 11 (FIGS. 1 and 2) by the mechanism 53. A swing arm formed of segments 96 and 98 joined at a pivot 97 is rotated about a fixed pivot 99 by an appropriate motor source. A second arm 101 is pivotally attached in its middle to another end of the arm 96, 98 at a point 103. As a first step in swapping the carriers 93 and 95, the arms are moved into the positions shown in FIG. 5A, wherein one end of the arm 101 engages the lifting hook of the carrier 93. The assembly is next moved, with the carrier 93 being carried along, to the position shown in FIG. 5B, wherein the other end of the arm 101 engages the hook of the carrier 95.

The two carriers 93 and 95 are now held closely together, so that rotation of the arm 101 with respect to the arm 96 about the pivot 103 may take place within a confined space. It is usually preferable to first move the swing arm 96, 98 to an intermediate position shown in FIG. 5C. Rotation of the arm 101 one-hundred eighty degrees in either a clockwise or a counter-clockwise direction then places the carriers in the positions shown in FIG. 5C. The arms are then operated in the reverse order from that shown in FIGS. 5A and 5B, to move the carriers 93 and 95 apart from one another the same distance as shown in FIG. 5A. It will be noted that the rotation is accomplished within a small area defined by a dashed circle 105. Although it is desired to maintain the pivot point 99 within that circle, in order to minimize the width of the vacuum chamber in which this mechanism is installed, it may be preferable in certain circumstances to move the pivot outside of the circle. One circumstance where this is preferable is where the pivot 99 and/or a motive source that drives the swing arm segment would be positioned in the path traversed by one of the carriers 93 and 95 when the arm 101 is rotated. Location of the pivot point 99 and a driving motive source outside of the circle 105 then removes this obstacle. The arm segment 96 is moved with respect to the arm segment 98 by another separately controlled motive source.

In order to process many wafers at once within the vacuum chamber 11 of the apparatus illustrated in FIGS. 1 and 2, the wafer carriers (45, 51) are made to hold a large number of wafers. The carriers can then become rather large, heavy and difficult to move in the manner discussed above. Therefore, in some circumstances, it is preferable to move only part of the wafer carrier at a time. An example of a carrier that can be moved in pieces is shown in FIG. 6. The domed surface is divided into multiple wedge or pie shaped segments, in this case five segments 107–111. The segments are held by a frame that includes a circular piece 113 that defines an outer circumference of the carrier. Extending radially outward between a central hub 115 and the circular piece 113 are five spokes, one between each of the wedge pieces 107–111.

Each wedge shaped segment includes a number of circular openings, such as the opening 117 in the wedge 110. A circular wafer having a diameter slightly larger than the diameter of these openings is held on the top of the domed surface over each of the openings by clips, in a usual manner. Each wedge includes a hook structure, such as the hook 119, with which the device 81 (FIG. 4) may be used to lift each wedge individually on and off of the carrier frame. Each hook is located in a position on the surface of its wedge shaped piece so that the wedge is balanced when lifted by the hook with a full load of wafers.

Instead of swapping entire wafer carriers in one operation, therefore, use of the segmented carrier requires a number of swapping operations, of the type discussed above, that equals the number of dome segments, in this case five. A greater ease and speed in transferring the individual segments, as opposed to transferring an entire carrier at a time, offsets some of the additional time required to make the five separate swaps. Of course, the carrier can be divided into some other number of segments than five, depending on the particulars of any given application.

FIG. 7 illustrates, in plan view, the use of segmented wafer carriers in a vacuum processing system to increase the throughput of the system. A carrier frame is positioned in each of an external loading area outside of the vacuum system, a load lock chamber and a processing chamber, as shown. The wedge shaped domed segments are then transferred one at a time between these frames. For example, segments may be transferred between the carrier frames of the load lock and processing chambers by either of the mechanisms discussed above with respect to FIGS. 3A–C and 5A–C. A swap of two segments 121 and 123 of adjacent carrier frames that are facing each other is shown being performed by dashed segment outlines in FIG. 7. These opposing segments are lifted from their respective carrier frames, moved together, rotated about a fixed pivot point 125 by 180 degrees, moved apart again and then set down on the opposite carrier frame from which they started. Each of the carrier frames in the load lock and processing chambers are then rotated by 72 degrees and two new wedge shaped carrier segments that face each other are swapped. This occurs five times, after which a gate valve between the load lock and processing chambers is closed. A fresh batch of wafers is then processed within the processing chamber.

During the time that wafers on the carrier within the processing chamber are being processed, a gate valve between the load lock chamber and an outside loading dock is opened and wafer carrying segments are exchanged between the carrier frames in those two places. This can be accomplished in the same way as described above for the transfer between the carriers within the load lock and processing chambers. Alternatively, when there are not space constraints that dictate otherwise, opposing segments need not be moved together and apart before and after rotation, thus simplifying the transfer mechanism somewhat. The transfer mechanism can then be a single arm 127 having a length that extends between opposing carrier segment hooks, with rotation about a fixed pivot 129.

As an alternative to the segment swapping arm 127, a standard available robotic arm mechanism can be used to move the segments one at a time between the load lock chamber and the external loading dock. This does not require that the segment frames in the external loading dock and the load lock chamber be rotated between transfers. The same robot arm can also be used to load and unload wafers from the segments when positioned on the loading dock. Indeed, although not preferred because of the reduced throughput that results, the wafers can be loaded and unloaded from the outside of the load lock chamber directly onto and from the domed surface in the load lock chamber.

The wedge shaped wafer carrier segments can be further reduced in size in order to take less space to swap them between the load lock and processing chambers. This is illustrated in FIG. 7, where a pointed end of the segment 121 is alternatively shown to be cut off along a line 131, as an alternative to the shape previously shown and discussed. Similarly, the segment 123 is shown to alternatively be truncated along a line 133. This may reduce the number of wafers that can be carried by an individual segment by one but has the advantage of taking less space to rotate about the pivot point 125, which can become important in specific configurations of the processing apparatus.

It will also be noted that the hooks provided as part of the wafer carrier segments shown in FIG. 7 are different than those shown in FIG. 6. A hook 135 attached to the segment 123 (FIG. 7), for example, has a looped shape that is different than the shape of the hook 119 of the carrier segment 110 (FIG. 6). Many alternative shapes can serve the purpose of allowing the segments to be individually lifted and moved.

The wafer carrier movement system of FIG. 7 can be implemented in the system described above with respect to FIGS. 1 and 2. A wafer carrier frame is hung from the top wall 15 within the processing chamber, one is laid on the support 35, and another positioned outside of the apparatus in a loading dock. Another motor is added to independently rotate each of these three frames during the carrier segment transfers. This system can also be implemented in more traditional processing apparatus having a vertical gate valve between the load lock and processing chamber, and another vertical gate valve between the load lock chamber and the external loading dock.

An advantage of the wafer transfer techniques described above is that they result in a high throughput of wafers being processed within the vacuum chamber. This, of course, reduces the per wafer cost of the processing. A time line diagram of FIG. 8 provides a summary of the operation of the system illustrated in FIG. 7. This diagram illustrates the parallelism that exists in the operation of the system. This results in an increased throughput of wafers. The top curve of FIG. 8 shows the repetitive transfer operations of the external loading dock as a function of time. The middle curve of FIG. 8 illustrates the operations occurring at the same times within the load lock chamber. The bottom curve of FIG. 8 identifies the operations of the processing chamber. All three curves are expressed with respect to a common horizontal time scale.

In a time interval m (FIG. 8), the loading dock is simultaneously receiving a previously processed wafer batch 0 from the load lock chamber through its opened external gate valve, and loading a fresh batch 2 of wafers into the load lock chamber. This wafer swapping is illustrated between the top and middle curves. Also during the interval m, a batch 1 of wafers is being processed within the processing chamber (bottom curve). Since the external gate valve of the load lock chamber is opened to the outside, the internal gate valve between the load lock chamber and the processing chamber is closed in order that a vacuum is maintained in the processing chamber.

During the next interval n of time, the processed wafers of batch 0 are unloaded from the external loading dock. The load lock chamber is closed to the outside, pumped down to a pressure approximating that of the processing chamber and the gate valve between the load lock and processing chambers is then opened. The processing of the wafer batch 1 continues during this time in the processing chamber.

Wafers are then transferred between the opened load lock chamber and the processing chamber during the next time interval p. The wafer batch 1 is moved out of the processing chamber and a fresh wafer batch 2 is moved into the processing chamber during this time.

In a next time interval q, the gate valve between the load lock chamber and the processing chamber is closed, the load lock chamber is vented to approximately atmospheric pressure, and the gate valve to the outside is then opened. During this time, the wafer batch 2 is being processed within the processing chamber, and a new batch 3 is being loaded into the loading dock.

After the sequential time intervals m, n, p and q, the same steps are repeated in the same order during subsequent time intervals with different batches of wafers. The same operations are performed during the time interval r as was done during the time interval m, except different batches of wafers are exchanged between the loading dock and the load lock chamber. Similarly, the operations occurring during the time interval n are repeated during the interval s, except that a different batch of wafers is being processed, another batch is present in the load lock chamber and a different batch is being unloaded from the loading dock.

In applications where an article swapping transport mechanism is not necessary, or where it is more complex than required for a particular application, a simpler but improved alternative transport mechanism illustrated in FIGS. 9 and 10 may be moved. The vacuum apparatus of FIGS. 9 and 10 is the same as that described above with respect to FIGS. 1 and 2, with the same reference numbers being used to identify corresponding features. The transport mechanism 53 of the earlier embodiment is implemented in FIGS. 9 and 10 by a carriage 151 that is freely moveable back and forth along supporting horizontal rails 153. When in a position under the load lock chamber (FIG. 9), a platform 155 attached to the top of the vertical movement mechanism 39 can contact an underside of the support 35 through an opening 157 in the carriage 151. The support 35 can then be moved between the position shown in FIG. 9, where the support 35 is resting on the carriage 151, and a position where the support 35 is sealed with the underside of the top wall 15 to form the load lock chamber 43 (FIG. 1).

The carriage 151 can be moved along the rails 153 by any convenient motive source. One suitable movement mechanism is a scotch yoke wherein a slot extending along the right side of the carriage 35 and into the page of FIGS. 9 and 10 carries a rod that sides back and forth in the slot as an arm attached to the rod is rotated by a motor or some other motive source. The platform 155 and mechanism 39 is, of course, retracted to a position illustrated in FIG. 10 that is below the carriage 151 before the carriage is moved along the rails. When the carriage 151 is in the position shown in FIG. 10, a hook 80 is dropped down from the carrier support mechanism 78 to engage the mating carrier hook 77 and lift the wafer carrier 45 upwards for processing and lower the carrier 45 down again onto the carriage after processing for transport back to the position shown un FIG. 9 under the load lock chamber.

The cyclic operation of the transport mechanism illustrated in FIGS. 9 and 10 is as follows. A carrier with unprocessed wafers is placed through the opening 29 onto the support 35 when sealed to the underside of the top wall 15. The lid 31 is then closed and sealed to the wall 15, and the pressure reduced within the sealed load lock chamber. After being lowered to a pressure substantially equal to that within the vacuum chamber 11, the supporting platform 155 is then lowered to lay the support 35 on the carriage 151 (FIG. 9), and the platform 155 is then lowered further to clear the carriage 151. The carriage 151 and wafer carrier are then moved to the processing position (FIG. 10) within the vacuum chamber 11. The hook 80 is then lowered to engage the wafer carrier hook 77 and raise the wafer carrier 45 above the carriage 151 (not shown) and the carriage 151 is moved back to the left side of the chamber 11 during processing of the wafers. After processing, the carriage 151 is moved back to the right side, under the wafer carrier, and the wafer carrier is lowered down onto the carriage. The carriage 151 is then returned to the left, the platform 155 is raised through the carriage opening 157 and lifts the support 35 up to seal with the underside of the top wall 15. The resulting load lock chamber is then vented, the lid 31 opened and the carrier or the wafers on it removed. Fresh wafers may then be placed into the load lock chamber for transport to the processing chamber.

Although the embodiment utilizing the carriage 151 is shown in FIGS. 9 and 10 to be implemented with the load lock chamber illustrated in FIGS. 1 and 2, such a carriage can also be used with a conventional load lock chamber having a vertical gate valve between it and the processing chamber. The way that the wafer carrier is loaded onto and unloaded from the carriage within the load lock chamber is different, of course, than that that shown in FIGS. 9 and 10.

The carriage is first positioned within the load lock chamber with its vertically oriented gate valve to the processing chamber closed and a vertically oriented gate valve to the outside opened. A robot arm on the outside, for example, then lifts the wafer carrier onto or off of the carriage from outside of the load lock chamber. After a carrier of fresh wafers is loaded onto the carriage, for example, the outside gate valve is closed, the load lock chamber pumped down, the gate valve into the processing chamber opened and the carriage moved into the processing chamber with the wafer carrier on it. The wafer carrier is then lifted into position for processing and the carriage is moved out from under the wafers during the processing. After processing, the wafer carrier is removed by placing it on the carriage and removing the carriage by a reverse of these steps.

Yet another simplified transport technique is illustrated generally by FIG. 11. A vacuum processing chamber 161 includes a location 163 for the processing of an article, and a location 165 that is in or aligned under a load lock chamber. This is similar to what has been described before. What is different in this arrangement, however, is the use of another location 167 within the vacuum chamber for the temporary storage of a wafer carrier, a portion of a wafer carrier or other article that is being moved between the two locations 163 and 165. A robotic arm 169 within the chamber 161 moves one article at a time between the locations 163, 165 and 167. One specific procedure is as follows. An article that has been processed is moved by the arm 169 from the location 163 to the location 167, and an article to be processed that has earlier been staged in the location 165 is moved from the location 165 to the location 163. The processed article is then moved from the location 167 to the location 165. The article in the location 165 is then removed from the load lock chamber and another to be processed substituted, during the time that the article in the location 163 is being processed. After this processing is complete, the sequence in movement of the articles is complete. Of course, this procedure may be modified by moving a fresh article into the exchange location 167 while another is being processed in the location 163, followed by moving the processed article directly from the location 163 to the location 165, then followed by movement of the fresh article from the location 167 to the location 163. As a further alternative, the robot arm 169 may be replaced with a rotating transfer device that operates similarly to the linear carriage shuttle 151 of the embodiment of FIGS. 9 and 10 except that this transfer device rotates.

A standard robot arm mechanism 171 may be used to move articles one at a time between the load lock chamber 165 and an external loading location 173. Alternatively, the articles may be transferred between the locatons 165 and 173 by simultaneous swapping of them, as previously described. In the case where the articles being processed are wafers, another robot mechanism 175 moves processed wafers from a carrier in the position 173 to wafer cassettes 177 and fresh wafers from the cassettes 177 to a carrier in position 173.

Such an exchange location can also be included in the embodiment of FIGS. 9 and 10 in order to increase the throughput of that processing machine. Another mechanism, not shown, is included within the vacuum chamber 11 to lift a wafer carrier off of the carriage 151 at an exchange location. This then allows another wafer carrier to be moved between the two positions shown in FIGS. 9 and 10, in the same manner as described with respect to FIG. 11 but with a different mechanism.

The sketch of FIG. 12 illustrates an evaporation machine for processing wafers that utilizes a particular combination of the wafer handling and transfer techniques described above. A dome wafer support frame 181 hangs within a processing chamber 183, which is shown with its side removed for the purposes of discussion. The frame 181 carries wedge shaped segments of the domed carrier surface, as described above with respect to FIGS. 6 and 7, with wafers not being shown in FIG. 12. Another similar frame 185 is suspended within a conventional load lock chamber 187, also shown with its side removed. A conventional gate valve 189 is positioned between the chambers 183 and 187. Another gate valve 191 is positioned between the load lock chamber 187 and the outside.

Carrier dome segments are transferred between the chambers 183 and 187 by a mechanism 193 which, in this example, is an arm that rotates to swap the positions of two wafer carrier segments at a time. A more conventional robot arm 195 loads and unloads carrier segments, one at a time, between the frame 185 in the load lock chamber 187 and a loading location 187 on the outside. The same robot arm 195 may be adapted for use to transfer wafers between carrier segments resting on the loading location 187 and a plurality of vertically stacked wafer cassettes 197, which cassettes may alternatively be arranged horizontally.

Although the various aspects of the present invention have been described with respect to specific examples and embodiments thereof, it will be understood that the invention is entitled to protection within the full scope of the appended claims.

It is claimed:

1. Vacuum apparatus for treating articles, comprising:
   a housing forming adjacent vacuum processing and load lock chambers with a first opening therebetween and a second opening between the load lock chamber and outside of the housing,
   a surface within the processing chamber that is moveable between at least first and second positions, wherein the first surface position covers and seals said first opening, and wherein the second surface position is removed within the processing chamber a distance away from said wall in order to allow articles to be moved through the first opening between the processing and load lock chambers,
   a cover provided adjacent the second opening that is moveable between at least first and second positions, wherein the first cover position seals said second opening from the outside, and wherein the second cover position allows articles to be passed through the second opening between the load lock chamber and the outside, and
   at least one vacuum pump connectable (1) to reduce pressure within the processing chamber when either the surface or the cover are in their first positions, and (2) to reduce pressure within a load lock chamber when both of the surface and the cover are in their said first positions.

2. The vacuum apparatus of claim 1, wherein the first and second openings are located at opposite ends of a passage through in a top wall of the housing and the surface is vertically moveable between its said first and second positions.

3. A vacuum chamber and a load lock chamber through which articles are moved into and out of the vacuum chamber for processing, comprising:
   a housing enclosing a compartment that includes an opening through a top wall thereof through which the articles may be moved, an article support surface within the compartment that is moveable between at least first and second positions, wherein the first support surface position covers and seals said opening by contacting an underside of the top wall around the opening in a manner that articles may be moved through the opening between outside of the housing and said surface, and wherein the second support surface position is removed within the compartment a distance downward away from said top wall, a cover provided outside of the compartment that is moveable between at least first and second positions, wherein the first cover position covers and seals said opening by contacting a top side of the top wall around the opening, and wherein the second cover position is removed a distance away from the top wall sufficient to allow articles to be passed through the opening, at least one vacuum pump connectable (1) to reduce pressure within the vacuum chamber that is formed within the compartment when either the article support surface or the cover are in their first positions, and (2) to reduce pressure within the load lock chamber that is formed within the compartment when both of the article support surface and cover are in their said first positions, and a transport mechanism within the housing that moves articles between athe article support surface when in its said second support surface position and a processing location removed from the second support surface position within the vacuum chamber.

4. The combination of claim 3, wherein the transport mechanism includes at least one pivotal arm that simultaneously engages two articles that are respectively on the article support surface when in its said second position and in the processing location, wherein rotation of the pivotal arm substantially one-hundred eighty degrees about an axis thereof exchanges positions of the two articles.

5. The combination of claim 4, wherein the transport mechanism also includes a sub-mechanism that cooperates with the pivotal arm to move two articles linearly toward and away from each other, wherein rotation of the pivotal arm substantially one-hundred eighty degrees about an axis thereof exchanges positions of the two articles when held toward each other.

6. The combination of claim 5, wherein the sub-mechanism includes a swinging arm to which the axis of said pivotal arm is attached.

7. The combination of claim 5, wherein the sub-mechanism includes additional arms pivotally mounted at ends of said pivotal arm.

8. The combination of claim 3, wherein the transport mechanism includes a carriage that moves the article support surface between the second support surface position and the processing location, said carriage including an opening for a mechanism to extend therethrough to move the article support surface between said first and second positions and be withdrawn below the carriage to allow its said lateral movement while the support surface rests thereon.

9. The combination of claim 3, wherein the transport mechanism includes a third position within the vacuum chamber for temporarily positioning articles while other articles are moved between the second support surface position and the processing location.

10. The combination of any one of claims 3–9, which comprises articles in the form of wedge shaped segments of a circular domed wafer carrier.

11. The combination of claim 10, wherein the wedge shaped segments are truncated along an edge opposite of a curved edge.

12. A mechanism for moving articles between a first position in a load lock chamber and a second position in an adjacent chamber that processes the articles, comprising:

an arm mounted to pivot about a point intermediate of said first and second locations, a sub-mechanism cooperating with the pivot arm that moves articles to a position closer together than when positioned at the first and second locations, and a control of the movement of the arm and sub-mechanism which first causes the sub-mechanism to move articles from said first and second locations to said positions closer together, then causes the pivot arm to rotate substantially one-hundred eighty degrees about its pivot point and thereafter causes the sub-mechanism to move the articles from said positions closer together to the first and second locations, whereby the positions of the articles at the first and second locations are exchanged.

13. The mechanism of claim 12, wherein the sub-mechanism includes a swinging arm to which the axis of said pivot arm is attached.

14. The mechanism of claim 12, wherein the sub-mechanism includes additional arms pivotally mounted at ends of said pivot arm.

15. The mechanism of any one of claims 12–14, which comprises articles in the form of wedge shaped segments of a circular domed wafer carrier.

16. The mechanism of claim 15, wherein the wedge shaped segments are truncated along an edge opposite of a curved edge.

17. A carrier of integrated circuit wafers, comprising:

a circular frame, a plurality of wedge shaped pieces supported on the frame to collectively form a domed surface across which wafers are positionable, and an carrying element attached to the individual wedge shaped pieces in a position such that the wedge shaped piece with wafers thereon is balanced when lifted off the frame by attachment only with the carrying element.

18. The carrier of claim 17, wherein pointed ends of the individual wedge shaped pieces are truncated.

* * * * *